United States Patent [19]
Peckman et al.

[11] Patent Number: 6,086,944
[45] Date of Patent: *Jul. 11, 2000

[54] METHOD FOR ACTIVATING A PLURALITY OF PHOTOCATHODES

[75] Inventors: Robert Peckman, Roanoke; Donald H. Stanley, Bedford; Roger M. Voss, Cloverdale; Joseph Herman Reich, Jr., Catawba, all of Va.

[73] Assignee: ITT Manufacturing Enterprises, Inc., Wilmington, Del.

[*] Notice: This patent issued on a continued prosecution application filed under 37 CFR 1.53(d), and is subject to the twenty year patent term provisions of 35 U.S.C. 154(a)(2).

[21] Appl. No.: 08/801,567

[22] Filed: Feb. 18, 1997

[51] Int. Cl.$^7$ ..................................... C23C 16/22
[52] U.S. Cl. .................. 427/8; 427/77; 427/78; 427/126.3; 427/255.31; 427/255.39; 445/3; 313/542

[58] Field of Search ..................................... 427/8, 77, 78, 427/126.3, 255.2, 255.3, 255.4, 250, 255.31, 255.39; 445/3, 10, 16; 313/542, 544

[56] References Cited

U.S. PATENT DOCUMENTS 4,999,211   3/1991   Duggan ........................................ 427/8

*Primary Examiner*—Timothy Meeks
*Attorney, Agent, or Firm*—McDermott, Will & Emery

[57] ABSTRACT

The present invention involves a method for simultaneously applying an activation layer on the photoemissive layers of a plurality of photocathodes such as those used in image intensifier devices. The method includes the steps of diffusing a flux of activating chemicals over the plurality of photocathodes, wherein the flux is substantially spatially uniform with respect to the plurality of photocathodes; monitoring the sum photoresponse of the plurality of photocathodes; and terminating the flux of activating chemicals when a desired sum photoresponse is attained.

19 Claims, 4 Drawing Sheets

METHOD FOR ACTIVATING A PLURALITY OF PHOTOCATHODES

FIELD OF THE INVENTION

This invention relates to a method for depositing an activation layer on photocathodes which can be used to simultaneously deposit activating layers on a plurality of photocathodes. The photocathodes are used for image intensifier devices, photomultiplier tubes, photon counter, and light-controlled electron sources, as in lithography and electron accelerators.

BACKGROUND OF THE INVENTION

For general background regarding photocathodes, reference is made to the following patents: U.S. Pat. No. 4,999,211, issued Mar. 12, 1991, in the name of Daniel D. Duggan, entitled "Apparatus and Method for Making a Photocathode" ("Duggan '211"); U.S. Pat. No. 5,114,373, issued May 19, 1991, in the name of Robert Peckman, entitled "Method for Optimizing Photocathode Photoresponse" ("Peckman '373"); and U.S. Pat. No. 5,298,831, issued Mar. 29, 1994, in the name of Avrham Amith, entitled "Method for Making Photocathodes for Image Intensifier Tubes." Each of these patents are assigned to ITT Corporation, the assignee herein, and they are incorporated herein by reference. As noted above, photocathodes are useful in image intensifier devices, photomultiplier tubes, photon counter, and light-controlled electron sources, as in lithography and electron accelerators. Image intensifier tubes have industrial and military applications, such as for enhancing the night vision of aviators, photographing astronomical bodies, and providing night vision to people who suffer from retinitis pigmentosa (night blindness).

A photocathode typically has a surface for receiving light and a photoemissive layer oppositely disposed to the light-receiving surface; light may be emitted from the photoemissive layer to an electron amplifier (or microchannel plate) and to an anode. The photoemissive layer of the photocathode is generally comprised of several layers of material. An anti-reflective layer is disposed on the surface facing the microchannel plate, which can be fabricated with silicon nitride ($Si_3N_4$). This is followed by a window layer and an active layer, both of which may be composed of gallium aluminum arsenide (GaAlAs), and gallium arsenide (GaAs), respectively. Lastly, it has been found that an activation chemical, such as cesium oxide, cesium fluoride, or barium fluoride, applied to the surface of the gallium arsenide is effective in increasing the quantity of electrons emitted from the photoemissive wafer.

For the photocathode to generate a flow of electrons, the photons of light directed at the photocathode must be captured in the active layer of the photoemissive wafer. This capturing of photons causes a release of electrons from the photoemissive wafer. The electrons must be released and proceed to the microchannel plate before being re-absorbed in the wafer. The activation layer serves to reduce the attractive force of the electrons so that a large portion of them escape the wafer, resulting in a large photo-response (PR). The amount of energy needed for an electron to leave the surface of the photocathode is called the work function. Photocathodes that are activated with an activation chemical can actually have a negative work function, so that electrons are repelled from the surface of the photocathode.

The activation layer is typically deposited on the photocathode surface by a vacuum deposition process. The current technology is to activate (apply an activation chemical to lower the work function and increase the PR), one photocathode at a time. For example, to deposit a cesium oxide activation layer, a photocathode is disposed in a vacuum chamber, and cesium gas is directed into the chamber and deposited on the photocathode, followed by an influx of oxygen gas. As the cesium and oxygen are deposited, electrons are released from the gallium arsenide layer. The rate at which the electrons are released, or the photoresponse (PR), is monitored during this process, as the photocathode is electrically connected to a power source and a PR meter. The stoichiometry of the activation chemicals is then adjusted during the application process based on the PR, as displayed by the PR meter.

Under current technology, the photocathodes have been activated individually. In fact, it had been believed that individual activation was necessary because of complexities involved in simultaneously monitoring the PR while adjusting the flow of activation chemicals. Imperfections in the activation surface are attractive sites to the electrons and regions immediately surrounding them have no PR, such that maintaining a properly uniform coating of activation chemicals is significant in improving the overall effectiveness of the photocathode. It had been thought that the differences in PR of the photocathodes, coupled with difficulties inherent in adjusting the stoichiometry of the activation chemicals, required an individualized application process.

To illustrate, in the activation process, cesium is introduced into the vacuum chamber by chemically reacting a cesium compound, such as cesium chromate, to release a diffused molecular vapor of cesium inside the vacuum chamber. The cesium on the cathode surface produces an increase in photo response which peaks after about 5 minutes. Then oxygen is introduced to co-deposit with the cesium to produce a cesium oxide. The flux of oxygen is controlled with a valve to maintain the correct stoichiometry. The stoichiometry is monitored by adjusting the oxygen flux so as to maximize the PR, while the cesium flux remains constant. And thus, it had been thought that an individualized process was necessary to make proper adjustments to the stoichiometry of the activation chemicals.

Shortcomings exist with regard to an individualized process. In particular, greater process time is necessarily consumed when activation layers are applied individually to one photocathode at a time.

Therefore, it is an object of the instant invention to provide a method of applying an activation layer to the photoemissive surface of the photocathode that may be used to simultaneously apply such activation layers to a plurality of photocathodes.

SUMMARY OF THE INVENTION

Summarily described, the invention embraces a method of simultaneously applying activating layers to the photoemissive layers of a plurality of photocathodes by diffusing a flux of activating chemicals over the photocathodes that is spatially uniform with respect to all the photocathodes and by monitoring the sum photoresponse of all the photocathodes.

BRIEF DESCRIPTION OF THE DRAWINGS

For a better understanding of the present invention, an exemplary embodiment of the invention is described below, considered together with the accompanying drawings, in which.

DETAILED DESCRIPTION OF THE DRAWINGS

Figure 1:
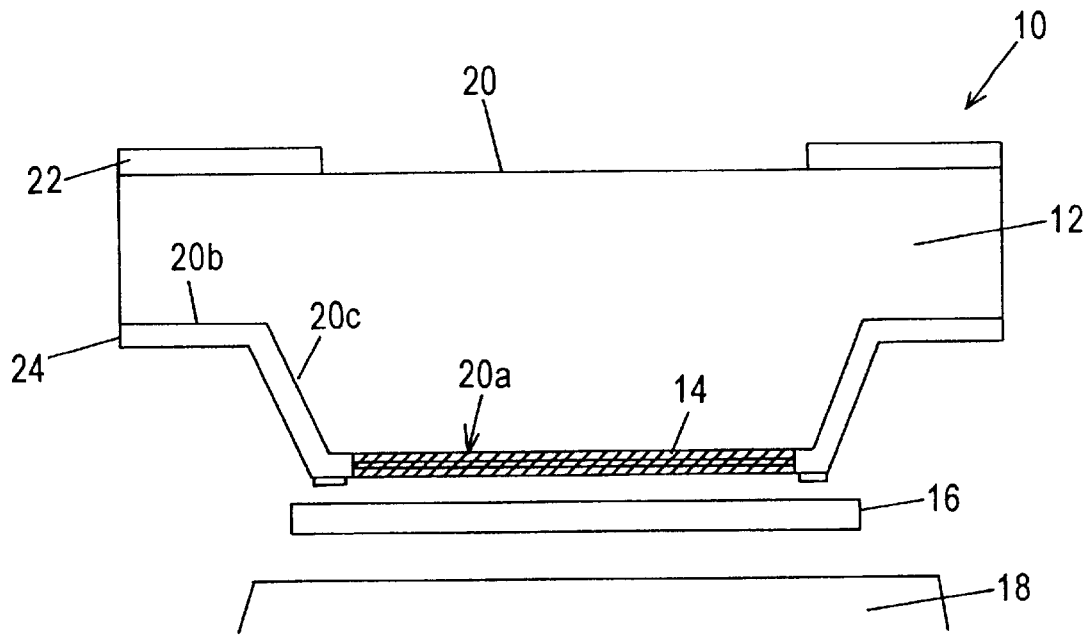
FIG. 1 is a cross-sectional view of an image intensifier tube with a photocathode made with the method of the present invention.

Referring to FIG. 1, there is shown an image intensifier tube having a photocathode 10, which comprises a face plate 12 and a photoemissive wafer 14; a microchannel plate 16 spaced from the photocathode 10; and an anode 18. The face plate 10 is made of optical material which is arranged to receive light at its surface 20.

A peripheral flange 22 typically surrounds the face plate and secures it within a housing (not shown). The image intensifier tube is designed so that light rays from the field of view penetrate the face plate at its surface 20. The face plate 12 also includes surface portions 20a and 20b which are generally parallel to surface 20, and a connecting surface portion 20c. The photoemissive wafer 14 is bonded to the surface 20a so that light impinging on the surface 20 eventually strikes the wafer 14, causing an emission of electrons. The electrons are directed across a gap to the microchannel plate 16, causing a secondary emission of electrons. The photoemissive wafer 14 is also connected to an external biasing power supply (not shown) by a conductive contact layer 24, which is applied over the surfaces 20a, 20b, and also over a portion of surface 20a, to contact the photoemissive wafer 14.

Figure 1A:
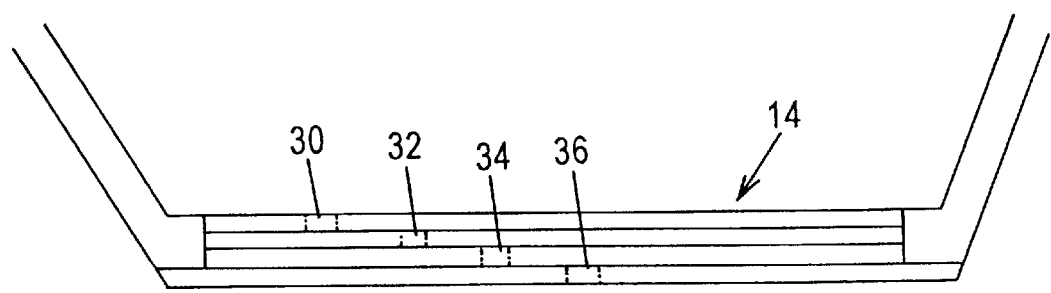
FIG. 1A reflects an enlarged view of the photoemissive layer of the photocathode depicted at the shaded region of FIG. 1.

Referring to FIG. 1A, there is shown in more detail the photoemissive wafer 14 of FIG. 1. The wafer comprises four layers: an anti-reflective layer 30, which is formed of silicon nitride ($Si_3N_4$); a window layer 32 formed of gallium aluminum arsenide (GaAlAs), deposited on the layer 30; an active layer 34 formed of gallium arsenide (GaAs), deposited on the layer 32; and an activation layer 36, formed by depositing an activation compound, such as cesium oxide (CsO), on the outer surface of the gallium arsenide layer 34.

A photocathode with photoemissive wafer may be formed in any known manner and constructed of materials known for this use.

Figure 2:
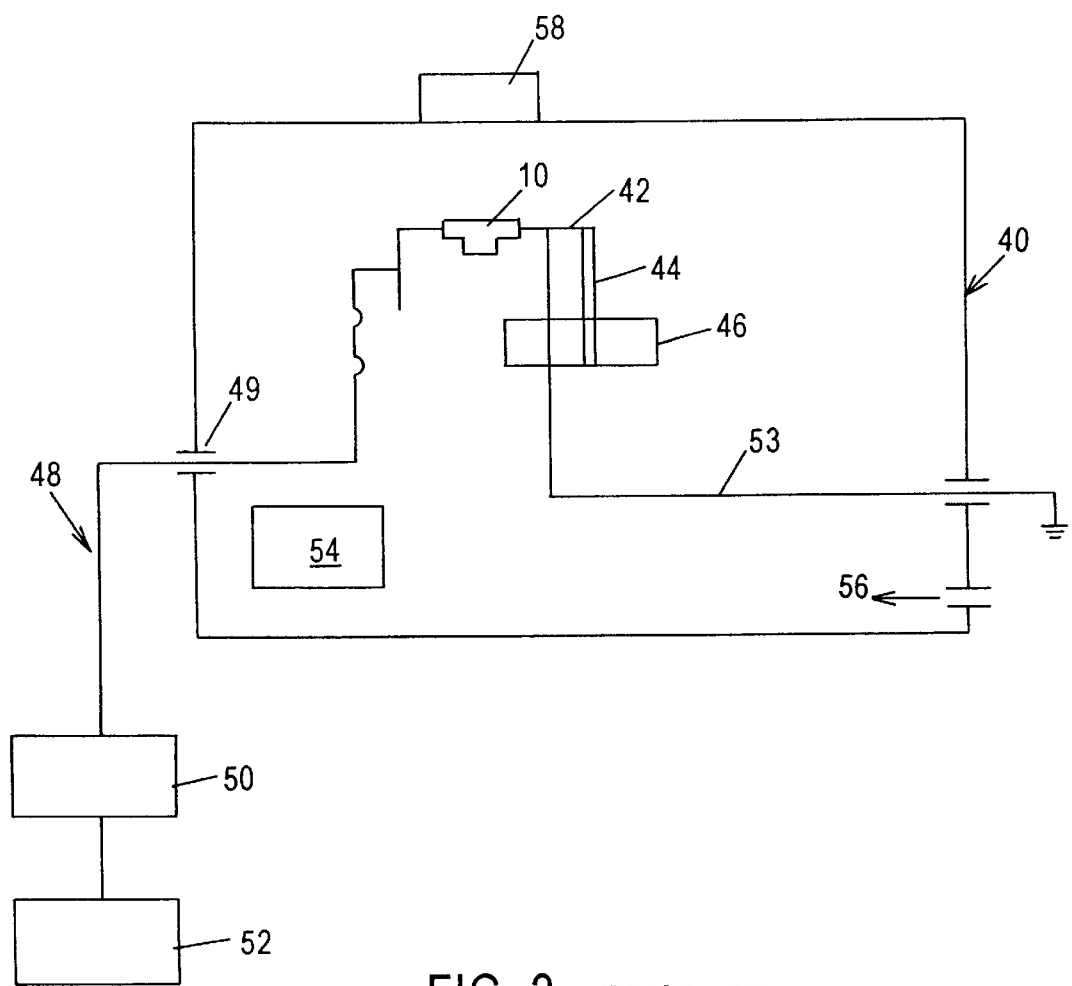
FIG. 2 depicts an apparatus used for a prior art method of applying an activating layer to a single photocathode.

FIG. 2 reflects an apparatus used for a prior art method of applying an activating layer to the photoemissive wafer of a single photocathode. A photocathode 10 is disposed within a vacuum chamber 40. The photocathode 10 is supported by a process tray 42, which is likewise supported by a ceramic stand 44 and connected to a rotating carousel 46. The ceramic stand electrically isolates the process tray 42 from the carousel 46.

An electrical lead 48 enters through a feed wall 49 in the vacuum chamber 40; it is coupled at one end to the conductive contact layer of the photocathode (shown in FIG. 1 at 24), and at the other end to a photoresponse meter 50 and a DC power source 52. The process tray is connected to ground by a lead 53 that enters the chamber wall via a feed-through. The cesium is created within the system with a heated cesium chromate channel 54. Inlet feed port 56 is provided in the surface of the vacuum chamber for diffusing oxygen gas into the chamber. A light source 58 is provided and so disposed that light rays are directed at the surface of the photocathode (depicted in FIG. 1 at 20).

The prior art method for which the apparatus of FIG. 2 is used is substantially described in the Duggan '211 patent. Basically, cesium gas is generated within the chamber and it is deposited on the photocathode. Oxygen gas is then directed into the chamber at inlet port 56. The cesium gas and oxygen gas react, and a cesium oxide layer is deposited on the gallium arsenide outer layer of the photocathode. Meanwhile, the light source 58 is applied to direct light rays at the surface of the photocathode, causing electrons to be released from the gallium arsenide layer and detected by the photoresponse meter 50, which is electrically connected by the lead 48 to the photocathode. The stoichiometry of the activation chemicals is then adjusted during the application process based on the PR, as displayed by the PR meter. Methods for optimizing the PR are further described in the patents previously incorporated herein by reference.

Figure 3:
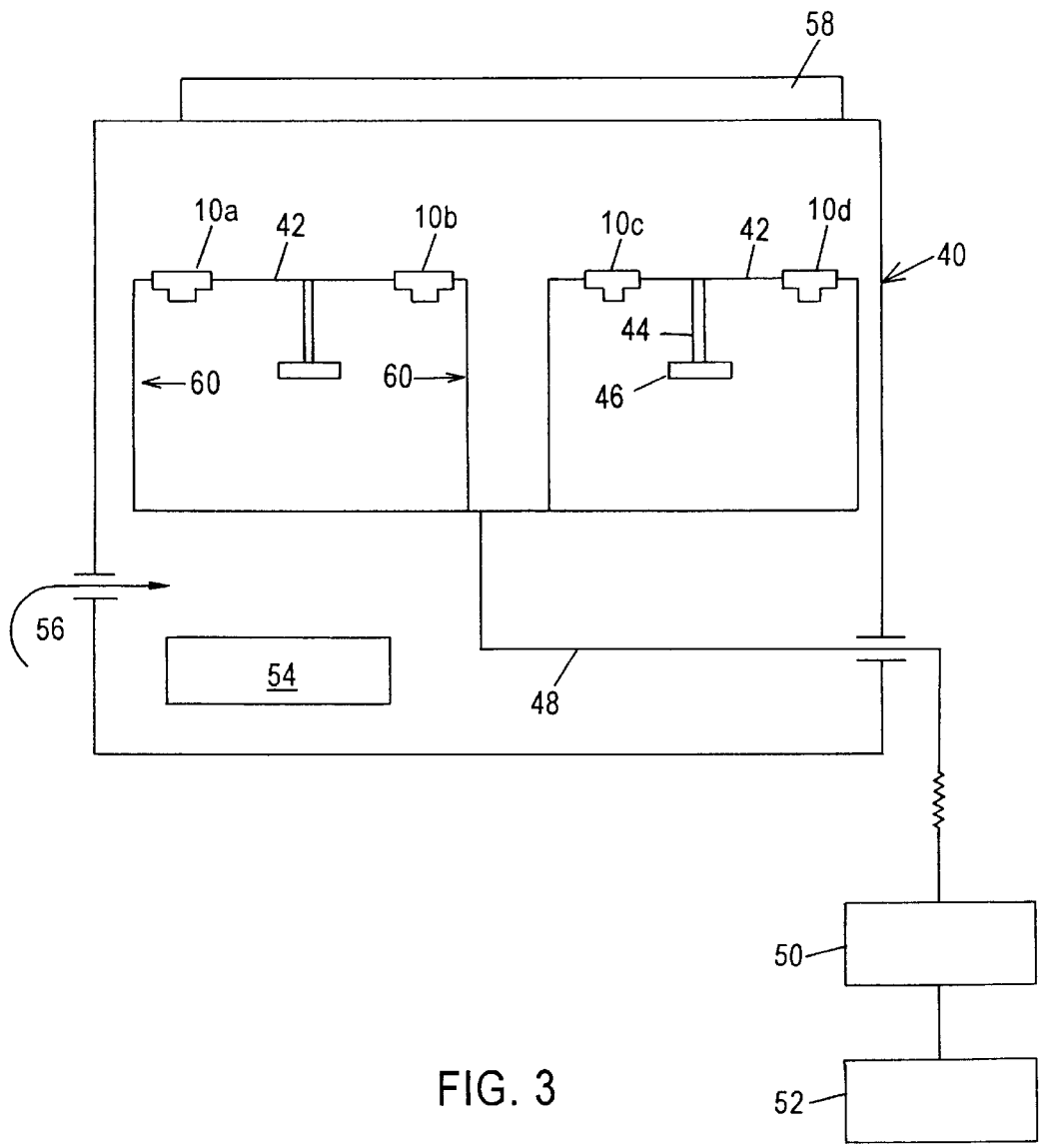
FIG. 3 depicts one embodiment of the present invention method.

Referring now to FIG. 3, there is shown the method of the present invention. This embodiment shows four photocathodes 10a, 10b, 10c, and 10d, disposed within the vacuum chamber 40. The photocathodes are supported by the process tray 42, likewise supported by a stand 44 and a rotating carousel 46. The process tray 42 is composed of an electrically conductive material, whereas the stand is made from a non-electrically conductive material, such as ceramic. An electrical lead 48 connects the photocathodes to a response meter 50 and a power source 52. A cesium chromate channel 54 is disposed within the vacuum chamber. An inlet port 56 is provided for infusion of oxygen gas, and a light source 58 is provided to illuminate the photocathode to enable it to convert photons to electrons. A ground lead also can be connected to the process tray, as shown in FIG. 2.

In FIG. 3, the novelty of the instant invention is shown by the plurality of the photocathodes and the individual electrical leads 60 connecting each of the photocathodes in parallel to the electrical lead 48.

In applying the activation layer to the photocathodes in plurality, the cesium gas is first generated within the system. The diffusion of the cesium gas should be spatially uniform and maintained at a constant rate. Preferably, the cesium channel 54 should be configured and disposed relative to the photocathode to maximize the spatial uniformity of the cesium gas relative to the photocathodes. This can be done by a manner known in the field, such as with use of a diffuser.

The cesium gas is continuously generated within the chamber until a peak photocurrent of approximately the number of photocathodes times $3 \times 10[-9]$ amps is attained. Thus, if four photocathodes are used, the cesium gas is applied at a constant rate until a photocurrent on the order of $12 \times 10[-9]$ amps is attained. This is called the "cesium rise" of the photocathode. It has been found that minor variations may exist in the PR for each photocathode without significantly affecting the effectiveness of the activation process as a whole. In other words, it has been found that the sum photoresponse of all photocathodes is an adequate reference for adjusting the stoichiometry of activation chemicals when the diffusion of activation chemicals is spatially uniform. The sum photoresponse of the plurality of photocathode s can be measured either consecutively or simultaneously.

Once the cesium rise is attained, the flow of oxygen is started through the inlet port 56. In methods previously known and described, such as in the Duggan patent '211, the oxygen is diffused into the vacuum chamber on a continuous basis. An oxygen valve, which diffuses oxygen gas into the chamber, is used to continually adjust the flow while the PR is monitored on the PR meter 50. With the influx of oxygen, an oxidation reaction occurs, transforming the cesium into a layer of cesium oxide. The oxygen continues to be adjusted until the photo current reaches a peak value, which values have been previously set forth. At this point, the process can be terminated.

Figure 4:
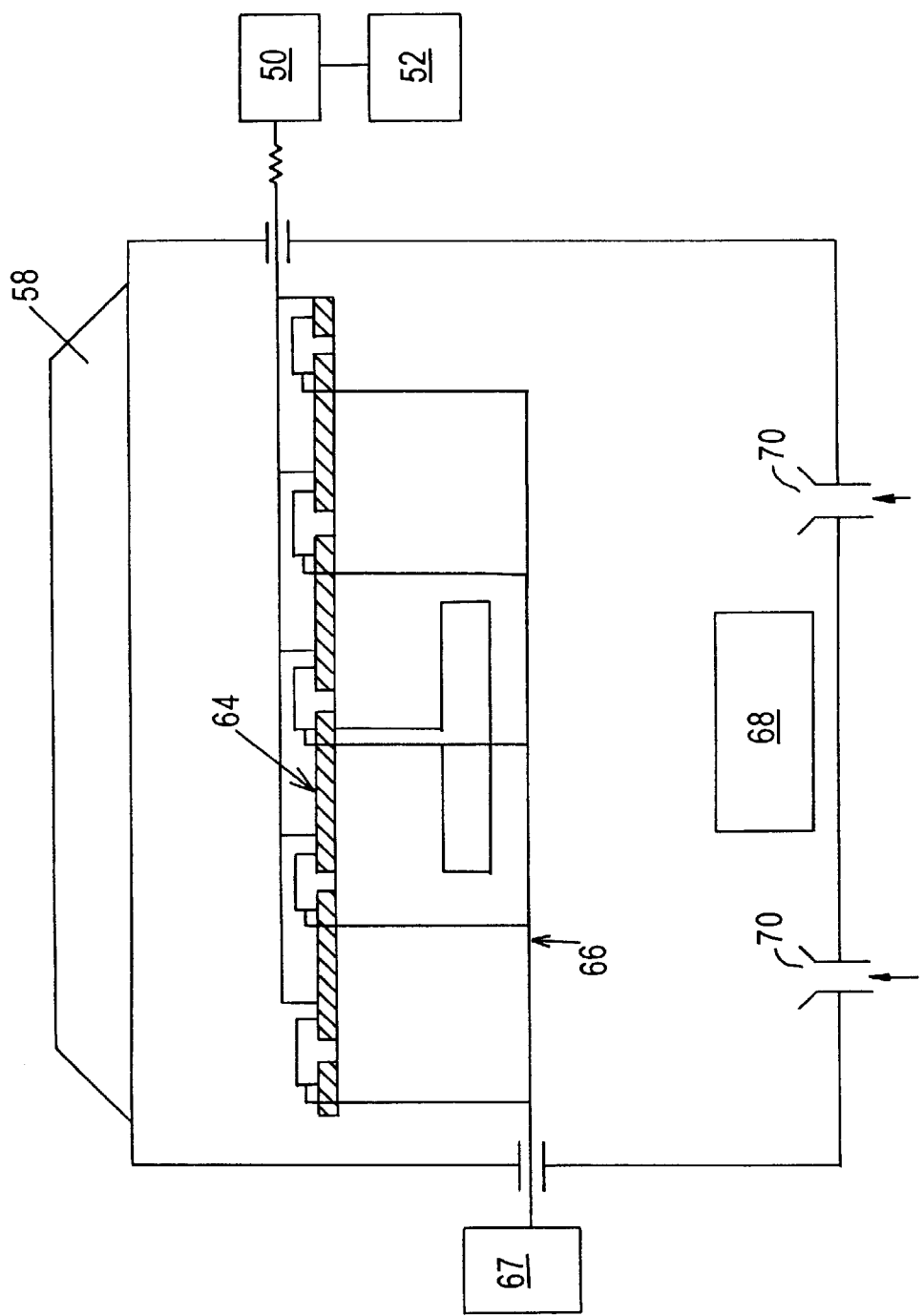
FIG. 4 depicts an alternative embodiment of the present invention method.

Referring now to FIG. 4, an alternative embodiment of the method is shown. The photocathodes are shown supported along one process tray 64, designed to accommodate a plurality of photocathodes. An electrical contact wire 66 is provided, which is fed through the chamber wall and connected to a meter 67 as a means for determining whether the photocathodes are being provided with electrical power. The cesium is generated by the cesium channel 68 inside the chamber at a spatially uniform rate. The oxygen is diffused after entering its port 70 to achieve spatial uniformity relative to the photocathodes and the cesium gas.

It will be understood that the embodiments described herein are exemplary and a person skilled in the art may vary or modify the invention without departing from its spirit and scope. It should be understood that although the preferred embodiment employs gallium arsenide photocathodes with cesium oxide activating layers, the method of this invention could be used with other types of photocathodes and activation layers. Additionally, any supplies that expose the photocathodes to substantially equal fluxes can function for multiple-cathode activation. Also, although the embodiments depict the photocathodes arranged in parallel, they could be arranged in series. All such variations and modifications are intended to be included within the scope of the appended claims.

We claim:

1. A method of applying an activation layer to a photoemissive layer of each of a plurality of photocathodes, comprising the steps of:
   (a) diffusing a flux of activating chemicals over the plurality of photocathodes, wherein the flux is substantially spatially uniform with respect to the plurality of photocathodes;
   (b) monitoring the sum photoresponse of the plurality of photocathodes; and
   (c) terminating the diffusion of the flux activating chemicals when the monitored sum photoresponse attains a desired value.

2. The method of claim 1, wherein the step of monitoring the sum photoresponse (step b), further comprises monitoring the sum photoresponse of the plurality of photocathodes simultaneously.

3. The method of claim 1, wherein the step of monitoring the sum photoresponse (step b), further comprises placing the photocathodes in an electrical circuit and arranging the photocathodes in parallel.

4. The method of claim 1, wherein the activating chemicals used in step (a) are selected from the group consisting of cesium oxide, cesium fluoride, barium oxide, barium fluoride, and combinations thereof.

5. The method of claim 1, wherein the step of diffusing the flux of activating chemicals further comprises:
   (a) diffusing a flux of a first gas over the plurality of photocathodes, wherein the flux of the first gas is maintained at a substantially temporally constant rate and is diffused in a substantially spatially uniform pattern over the photocathodes; and
   (b) diffusing a second gas over the plurality of photocathodes such that the flux of the second gas is maintained at a substantially temporally variant rate, and wherein the flux of the second gas is diffused in a substantially spatially uniform pattern over the photocathodes.

6. The method of claim 5, wherein the first gas is selected from the group consisting of cesium gas and barium gas, and wherein the second gas is selected from the group consisting of oxygen gas and fluoride gas.

7. The method of claim 6, wherein the photoemissive layer of each of the plurality of photocathodes is fabricated from gallium arsenide.

8. The method of claim 1, wherein the photoemissive layer of each of the plurality of photocathodes is fabricated from gallium arsenide.

9. A method of applying an activation layer to a photoemissive layer of each of a plurality of photocathodes, the plurality of photocathodes having electrically conductive layers surrounding a portion of the outer surface thereof and contacting the photoemissive layers, comprising the steps of:
   (a) diffusing a flux of activating chemicals over the plurality of photocathodes, wherein the flux is substantially spatially uniform with respect to the plurality of photocathodes;
   (b) placing the photocathodes in an electrical circuit connected to a photoresponse meter and a power source; and
   (c) actuating the power source to send current to the photoresponse meter and to the plurality of photocathodes;
   (d) monitoring the sum photoresponse of the plurality of photocathodes; and
   (e) terminating the diffusion of the flux activating chemicals when the monitored sum photoresponse attains a desired value.

10. The method of claim 9, wherein the step of placing the photocathodes within the electrical circuit (step b), is performed by connecting one end of an electrical lead to a power source and connecting an opposite end of the electrical lead to the electrically conductive layers of the plurality of photocathodes.

11. The method of claim 9, wherein the step of diffusing the flux of activating chemicals (step a) further comprises:
   (a) diffusing a flux of a first gas over the plurality of photocathodes, wherein the flux of the first gas is maintained at a substantially temporally constant rate and is diffused in a substantially spatially uniform pattern over the photocathodes; and
   (b) controlling a second gas over the plurality of photocathodes such that the flux of the second gas is maintained at a substantially temporally variant rate; wherein the flux of the second gas is diffused in a substantially spatially uniform pattern over the photocathodes.

12. The method of claim 11, wherein the first gas is selected from the group consisting of cesium gas and barium gas, and wherein the second gas is selected from the group consisting of oxygen gas and fluoride gas.

13. The method of claim 12, further comprising the step of supporting the plurality of photocathodes within the vacuum chamber by means of at least one process tray.

14. The method of claim 11, further comprising the steps of disposing the plurality of photocathodes within a vacuum chamber, the vacuum chamber having at least one inlet aperture for the introduction of gas and an electrical lead into the vacuum chamber; and wherein the flux of the second gas is diffused over the plurality of photocathodes by injecting the gas into the vacuum chamber through the at least one inlet aperture.

15. A method of applying an activation layer to a photoemissive layer of each of a plurality of photocathodes, the plurality of photocathodes having electrically conductive layers surrounding a portion of the outer surface thereof and contacting the photoemissive layers, comprising the steps of:

(a) disposing the plurality of photocathodes with a vacuum chamber, the vacuum chamber having a plurality of inlet apertures for the introduction of gas and an electrical lead into the vacuum chamber;

(b) supporting the plurality of photocathodes within the vacuum chamber;

(c) connecting an electrical lead at one end to a power source and a photoresponse meter, and connecting an opposite end of the electrical lead to the electrically conductive layer of the plurality of photocathodes;

(d) transmitting light to the photocathodes disposed within the vacuum chamber;

(e) actuating the power source to send current to the photoresponse meter and to the plurality of photocathodes;

(f) diffusing a flux of activating chemicals over the plurality of photocathodes, wherein the flux is substantially spatially uniform with respect to the plurality of photocathodes;

(g) monitoring the sum photoresponse of the plurality of photocathodes by means of the photoresponse meter; and (h) terminating the diffusion of the flux activating chemicals when the monitored sum photoresponse attains a desired value.

16. The method of claim 15, wherein the photocathodes are arranged in parallel.

17. The method of claim 15, wherein the step of diffusing the flux of activating chemicals further comprises:

(a) diffusing a flux of a first gas over the plurality of photocathodes, wherein the flux of the first gas is maintained at a substantially temporally constant rate and is diffused in a substantially spatially uniform pattern over the photocathodes, and wherein the first gas is selected from the group consisting of cesium gas and barium gas; and (b) controlling a second gas over the plurality of photocathodes such that the flux of the second gas is maintained at a substantially temporally variant rate; wherein the flux of the second gas is diffused in a substantially spatially uniform pattern over the photocathodes; and wherein the second gas is selected from the group consisting of oxygen gas and fluoride gas.

18. The method of claim 17, wherein the first gas is comprised of cesium gas and the second gas is comprised of oxygen gas.

19. The method of claim 15, wherein the photoemissive layer of each of the plurality of photocathodes is fabricated from gallium arsenide.

* * * * *